United States Patent
Bjesse et al.

(10) Patent No.: US 7,890,894 B2
(45) Date of Patent: Feb. 15, 2011

(54) PHASE ABSTRACTION FOR FORMAL VERIFICATION

(75) Inventors: Per Bjesse, Portland, OR (US); James H. Kukula, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 600 days.

(21) Appl. No.: 12/015,463

(22) Filed: Jan. 16, 2008

(65) Prior Publication Data

US 2008/0134114 A1    Jun. 5, 2008

Related U.S. Application Data

(62) Division of application No. 11/123,697, filed on May 5, 2005, now Pat. No. 7,343,575.

(51) Int. Cl.
*G06F 17/50* (2006.01)
*G06F 9/45* (2006.01)

(52) U.S. Cl. .................................... 716/2; 716/4; 716/6
(58) Field of Classification Search ..................... 716/2, 716/4, 6
See application file for complete search history.

(56) References Cited

U.S. PATENT DOCUMENTS

2003/0040896 A1 * 2/2003 McWilliams et al. .......... 703/13
2003/0192018 A1   10/2003 Baumgartner et al.
2005/0091011 A1 * 4/2005 Bennoit et al. ................. 703/2
2006/0212837 A1   9/2006 Prasad

OTHER PUBLICATIONS

Baumgartner et al. "Model Checking the IBM Gigahertz Processor: An Abstraction Algorithm for High-Performance Netlists," Computer Aided Verification, 1999, 12 pages.
Hasteer et al. "Efficient Equivalence Checking of Multi-Phase Designs Using Phase Abstraction and Retiming," ACM Transactions on Design Automation of Electronic Systems (TODAES), vol. 3, No. 4, Oct. 1998, pp. 600-625.

* cited by examiner

*Primary Examiner*—Jack Chiang
*Assistant Examiner*—Suresh Memula
(74) *Attorney, Agent, or Firm*—Bever, Hoffman & Harms, LLP; Jeanette S. Harms

(57) ABSTRACT

A method for functional verification includes transforming an original multiphase circuit design into a phase-abstracted circuit design by identifying cyclical (repetitive) signals in the multiphase circuit design, determining a number of simulation phases for the multiphase circuit design, unwinding the multiphase circuit design by the number of phases to create an unwound design, and then applying logic reduction techniques to the unwound design using the clock-like signals to reduce (simplify) the logic in the unwound design by eliminating unused/unnecessary registers, inputs, outputs, and logic. The resulting phase-abstracted design can then be processed much more efficiently by functional verification engines than the original multiphase circuit design due to the reduced number of registers/inputs.

12 Claims, 12 Drawing Sheets

ORIGINAL DESIGN 301

PHASE-ABSTRACTED DESIGN 302

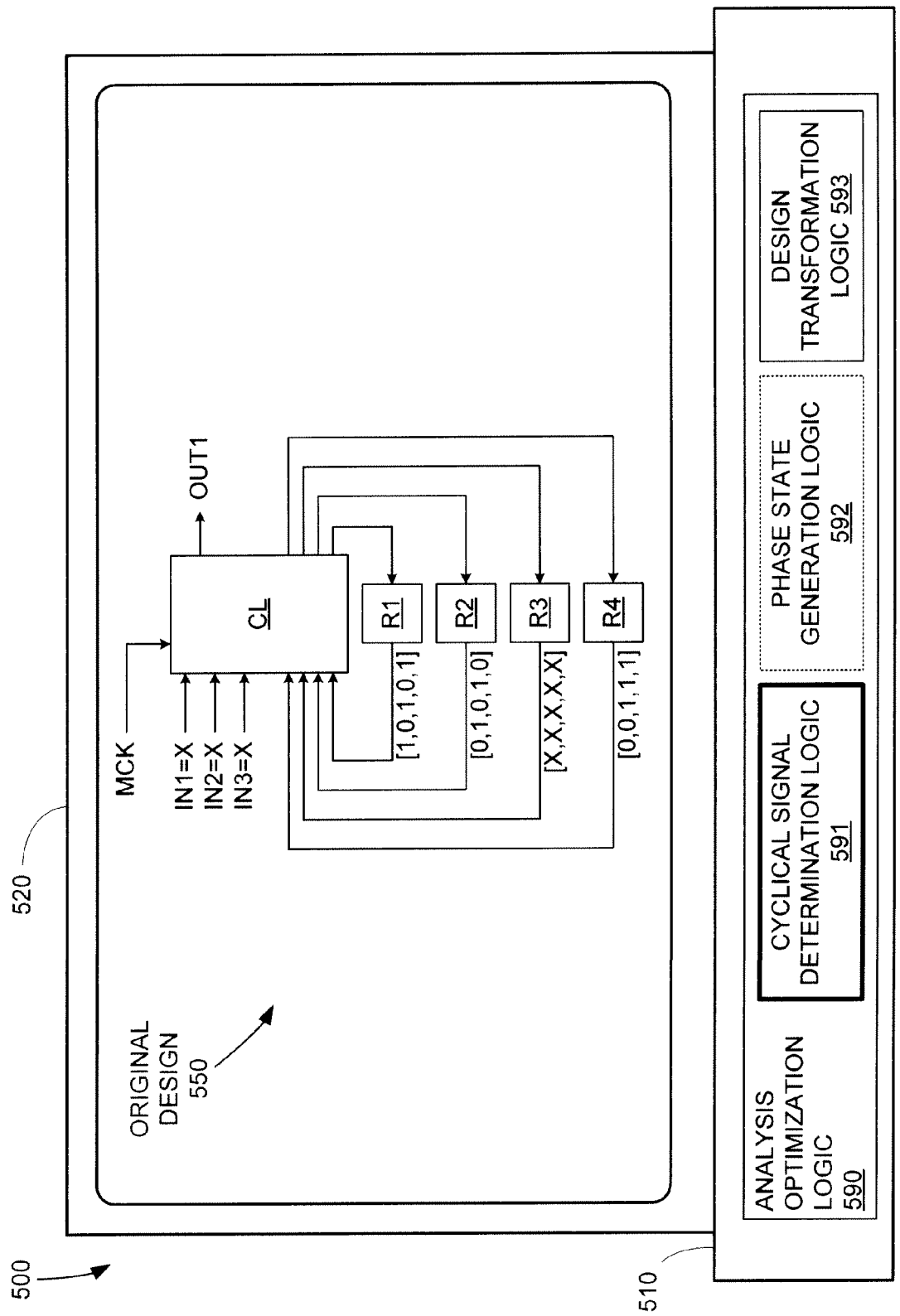

PHASE ABSTRACTION FOR FORMAL VERIFICATION

RELATED APPLICATIONS

This application is a divisional of U.S. patent application Ser. No. 11/123,697, entitled "Phase Abstraction For Formal Verification" filed May 5, 2005.

BACKGROUND OF THE INVENTION

1. Field of the Invention

The invention relates to the field of electronic design automation, and more particularly to a system and method for efficiently performing functional verification on a multiphase circuit design.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer). The models define performance parameters for the cells; e.g., parameters related to the operational behavior of the cells, such as power consumption, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for: manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS® family of products.

Modern functional verification tools (such as those listed above with respect to step E114) can face difficult challenges due to the implementation techniques circuit designers use to improve circuit performance (speed). One such technique is "multiphase clocking" in which the circuit designer simulates registers through the use of several non-overlapping clocks driving latches instead of flip flops. This multiphase clocking technique can allow the timing constraints on a circuit to be relaxed, while also increasing circuit robustness. However, the multiphase clocking technique results in circuit designs ("multiphase circuit designs") that are difficult for conventional functional verification tools to process due to the proliferation of latch elements. In an N-phase design style, a quantity "N" latches are used in place of every register, resulting in an analytical problem for the functional design tool that is N times larger than the original circuit design and exponentially more difficult to solve.

In general, conventional functional verification tools can only effectively process multiphase circuit designs that have been generated using rigid design styles. The strict limitations of such rigid design styles allow optimized circuit designs to be simplified for more efficient functional verification. For example, FIG. 2 shows a sample multiphase circuit design 200 that could be generated using a rigid two-phase design style. Circuit design 200 includes a first bank of logic B101, a first set of latches L111 coupled to receive the output of logic B101, a second bank of logic B102 coupled to receive the output of latches L111, and a second set of latches L112 coupled to receive the output of logic B102. Logic B101 operates in response to a set of inputs I0 through IN and the output of logic B102, while a set of outputs O0 through OM from latches L112 is provided as the output of circuit design 200.

The exemplary design style used to generate circuit design 200 includes the requirements that the circuit be driven by two clocks φ1 and φ2 that have opposite phases (other structural restrictions, such as the output of logic B102 only being able to feed latches L112 (and not latches L111), would also be specified by the design style). Thus, because clock φ1 feeds latches L111 and clock φ2 feeds latches L112, at any given time one set of latches will be acting like a wire, while the other set of latches will be acting like a register. In this manner, a single register can be simulated by two sets of latches, with logic B101 and B102 representing the logic originally associated with that single register. Typically, each of the banks of logic B101 and B102 will be smaller than the original logic associated with the single register, which in turn allows the logic to be made to operate faster.

For functional verification purposes, a pattern-matching operation can be performed in which a detection pattern 290 is compared with various portions of optimized circuit design 200. Detection pattern 290 is specified in the functional verification algorithm being applied to optimize circuit design 200, and is associated with an equivalent single-register implementation. Therefore, if a match is detected, the matching portion of optimized circuit design 200 (e.g., the portion encircled by the dashed line) can be transformed into a single-register implementation associated with detection pattern 290, thereby simplifying circuit design 200 for subsequent functional verification. Additional detection patterns can be used to transform different portions of optimized circuit design 200.

Unfortunately, this type of pattern-based transformation of optimized circuit design 200 is only effective when a rigid design style is used in the generation of optimized circuit design 200. Any non-conforming (i.e., syntactically different) design implementation, even if functionally equivalent (i.e., semantically identical) to detection pattern 290, will not be matched by detection pattern 290. Furthermore, conventional pattern-based transformation requires identification of all clocks (e.g., clocks φ1 and φ2), and more particularly, the relationships between those clocks, in optimized circuit design 200. Advanced timing enhancement techniques such as clock gating can make such identification non-trivial. Presently, clock identification is a manual process that is very difficult and time-consuming, and essentially requires that the circuit design being analyzed was generated using a very tightly controlled set of design specifications. Therefore, conventional functional verification techniques are not very accommodating of circuit design (and circuit designer) flexibility.

Accordingly, it is desirable to provide a system and method for performing functional verification on optimized circuit designs that does not require the use of rigid design styles and manual clock identification.

SUMMARY OF THE INVENTION

Advanced circuit design techniques such as multi-phase clocking can generate circuit designs that are computationally expensive for functional verification tools to process. By identifying repetitive signals within a design to extract multi-phase register characteristics, and by optimizing the design for analysis using those register characteristics, the computational requirements for processing multi-clocked circuit designs can be significantly reduced.

In essence, by monitoring register states under controlled conditions, a cyclical register state pattern (i.e., a repeating series of register state vectors) can be identified within a multiphase design. Then, by treating the cyclical pattern of data as clocked data, the multiphase design can be transformed into a "phase-abstracted" design that includes a reduced number of registers (and inputs) for easier processing during functional verification. The phase-abstracted design is created by first selecting a number of (simulation) phases for the multiphase design (based on the quantity and characteristics of register state vectors in the cyclical register state pattern), and then generating a final state vector for each of those phases from the original register state vectors. The multiphase design can then be "unwound"; i.e., the logic in the multiphase design can be duplicated "N" times, where N is the value of the selected number of different phases, and the duplicated logic sets are connected in series by replacing the registers in all but the first logic set with direct connections to adjacent logic sets.

In this "unwound design", each duplicated logic set can correspond to a particular phase of each of the clock-like signals, so that the corresponding state bit values from the previously defined final state vectors can be imposed at appropriate register locations (and former register locations) in the unwound design. The imposed values can then be allowed to propagate through the unwound design to eliminate as much logic as possible through simplifications resulting from the specification of actual values. Any remaining unused or unnecessary logic can also be removed from the unwound design at this point to finalize the phase-abstracted design.

In one embodiment, the clock-like signals can be detected through the use of three-valued simulation (i.e., values 0, 1, and X (unknown)) to apply a set of initial conditions to the original circuit design and then monitor register states as the design is clocked with held at the value X. When a repeated register state vector is detected, a cyclical series of register state vectors can be defined, starting with the original register state vector (i.e., the register state vector which is duplicated by the repeated register state vector) and ending with the register state vector immediately preceding the repeated register state vector. This cyclical series of state vectors represents an infinitely repeating set of state bit values for the registers in the original circuit design. In one embodiment, the register state vectors generated prior to the cyclical series of state vectors can be eliminated by incorporating them into corresponding ones of the cyclical series of state vectors.

In one embodiment, the number of (simulation) phases for the original circuit design can be selected based on the number of state vectors in the cyclical series of state vectors. To improve subsequent processing efficiency, the number of phases can be selected to be a divisor of the number of state vectors in the cyclical series of state vectors. In one embodiment, this divisor selection can be based in part on the range of periods for constant value (0 or 1) state bits (e.g., by selecting a number of phases that matches the mode for the state bit periods). In another embodiment, a phase number threshold can be defined such that the number of phases must be selected to be below that threshold value.

In another embodiment, unwinding the original circuit design can involve first duplicating the original circuit design a number of times equal to the selected number of phases. The duplicate logic sets can then be arranged in series, followed by removal of the registers from all but the first duplicate logic set in the series. For that first duplicate logic set, the connection between the registers and the register input nodes is broken, so that the registers feed into, but are not fed by, the first duplicate logic set. All the duplicate logic sets can then be joined in series by connecting the register input nodes and register output nodes of adjacent duplicate logic sets to form the unwound design. In one embodiment, the register output nodes of the last duplicate logic set in the series can also be connected to the inputs of the registers (at the first duplicate logic set).

In another embodiment, performing logic rewriting on the unwound design can involve first associating each of the duplicate logic sets with a unique (simulation) phase, and then imposing the state bit values from the corresponding final state vector at the appropriate register and register output node locations in the unwound design. A logic rewriting operation can then be performed by propagating those imposed values through the unwound design. In one embodiment, further logic reduction can be performed by removing any logic not in the recursive fan-in cones of the outputs remaining after the propagation of the imposed register values.

Note that while described above with respect as a methodology for performing multiphase circuit design verification, in various other embodiments, the methodology can be provided by logic within a verification system (or even an optimization system for generating a phase-adapted design from a multiphase circuit design), or by instructions in a software program.

In another embodiment, a system for detecting clock-like signals in a multiphase circuit design can include logic for applying a set of initial conditions to the multiphase circuit design using three-valued simulation, and logic for monitoring the behavior of a set of registers in the design as the design is clocked while the inputs to the design are held at value X. The system also includes logic for identifying repeating bit patterns at the registers and designating those repeating bit patterns as the clock-like signals. Note that in another embodiment, a software program can include instructions for causing a computer to provide the capabilities of the above system for detecting clock-like signals.

The invention will be more fully understood in view of the following description and drawings.

BRIEF DESCRIPTION OF THE DRAWINGS

FIGS. 5A, 5B, 5C, 5D, 5E, 5F, and 5G are schematic diagrams of a system for performing phase abstraction for circuit design optimization for functional verification.

DETAILED DESCRIPTION

Advanced circuit design techniques such as multi-phase clocking can generate circuit designs that are computationally expensive for functional verification tools to process. By identifying repetitive signals within a design to extract multi-phase register characteristics, and by optimizing the design for analysis using those register characteristics, the computational requirements for processing multi-clocked circuit designs can be significantly reduced.

Figure 1:
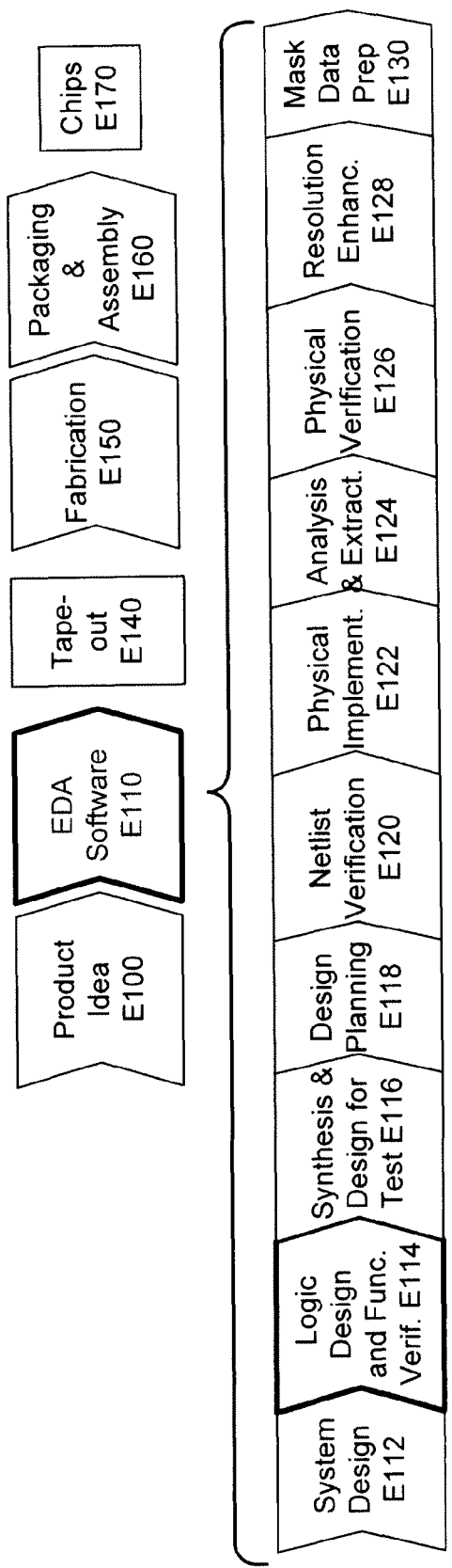
FIG. 1 is a simplified flow diagram of a standard EDA process flow.
Figure 2:
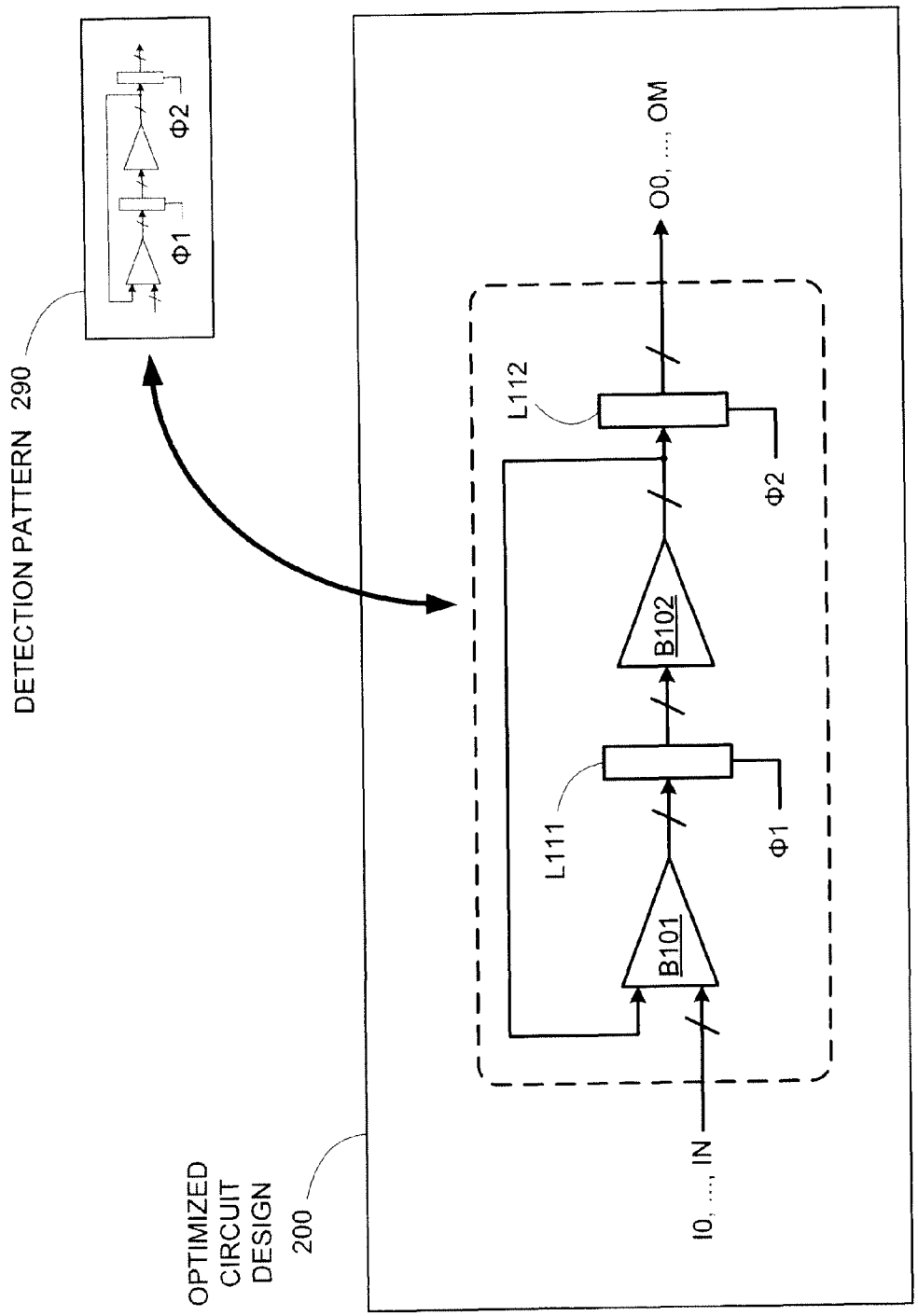
FIG. 2 is a schematic diagram of a circuit design being optimized using conventional pattern matching.
Figure 3:
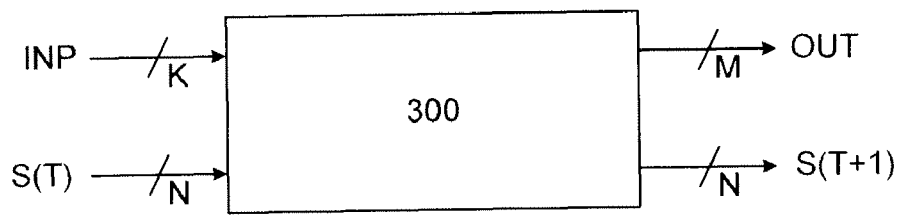
FIG. 3 is a block diagram of a circuit design optimization for functional verification using phase abstraction.
Figure 3:
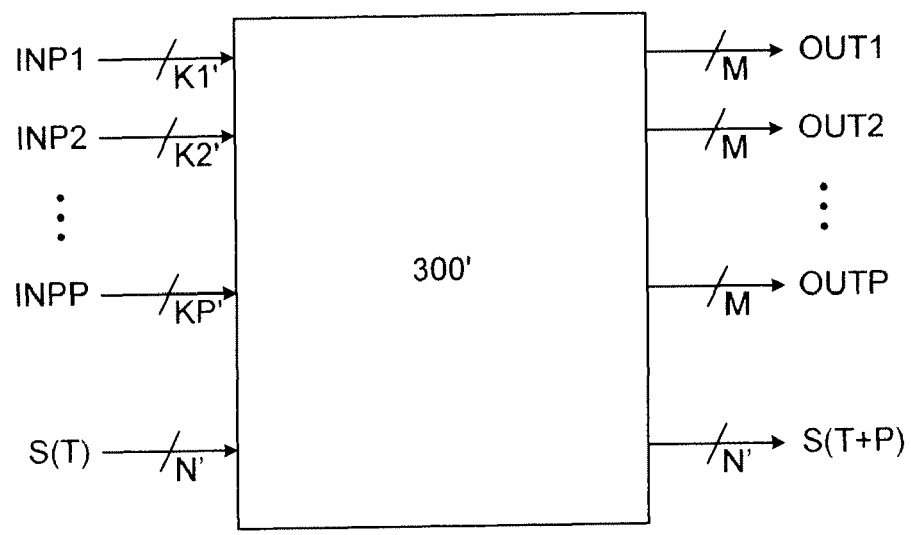

FIG. 3 shows a high-level block diagram of a design optimization for functional verification. In FIG. 3, an original circuit design 301 includes original logic 300 that receives a quantity "K" inputs INP and a quantity "N" register states S. At a time T, logic 300 receives inputs INP and register state values S(T), and in response generates a quantity "M" outputs OUT and updates the N register states to values to S(T+1).

As noted above, the larger the number of register states S (i.e., the larger the number of registers in design 301), the more difficult design 301 is to analyze during functional verification. Therefore, to reduce analytical complexity, original design 301 is transformed into a phase-abstracted design 302. Specifically, the (expected) number of phases in original design 301 is extracted, and phase-abstracted design 302 is generated by unwinding and optimizing original logic 300 into expanded logic 300' based on that number of phases (described in greater detail below). Note that the precise number of phases in original design 301 need not be used to generate phase-abstracted design 302, since the unwinding and optimization processes will generally provide a beneficial reduction in register quantity, even if the phase quantity value used is not exactly correct.

Thus, if the original design includes an (expected) quantity "P" phases, original logic 300 can be unwound into expanded logic 300', such that expanded logic 300' effectively takes P time steps for each clock tick (compared to the single time step per clock tick exhibited by original logic 300). Thus, whereas original logic 300 would cycle through P clock ticks to run through all its phases, expanded logic effectively subsumes all those phases in a single clock tick. To provide state information for the intermediate time steps that are no longer explicitly clocked, expanded logic 300' includes sets of outputs OUT1, OUT2, . . . , and OUTP to provide output values corresponding to the outputs that would be provided by original logic 300 at times 1, 2, . . . , and P, respectively.

Meanwhile, additional sets of inputs INP1, INP2, and INPP are incorporated into expanded logic 300' to represent input values that would be provided to original logic 300 at times 1, 2, . . . , and P, respectively. However, due to logic reduction that will tend to occur during the unrolling and optimization processes, each of input sets INP1, INP2, . . . , and INPP will actually provide quantities K1', K2', . . . , and KP' of input signals that will all typically be less than quantity K. In many cases, the total number of inputs provided to expanded logic 300' (i.e., the sum of quantities K1' through KP') will be less than the number of inputs (K) provided to original logic 300.

At the same time, the unwinding and optimization processes will typically allow the quantity "N" of register states S (and hence the number of registers) to be reduced to a quantity "N'" that significantly reduces the computing requirements for functional verification. In this manner, a multi-clocked circuit design (301) can be transformed into a phase-abstracted circuit design (302) that can be efficiently processed by conventional functional verification systems.

Figure 4A:
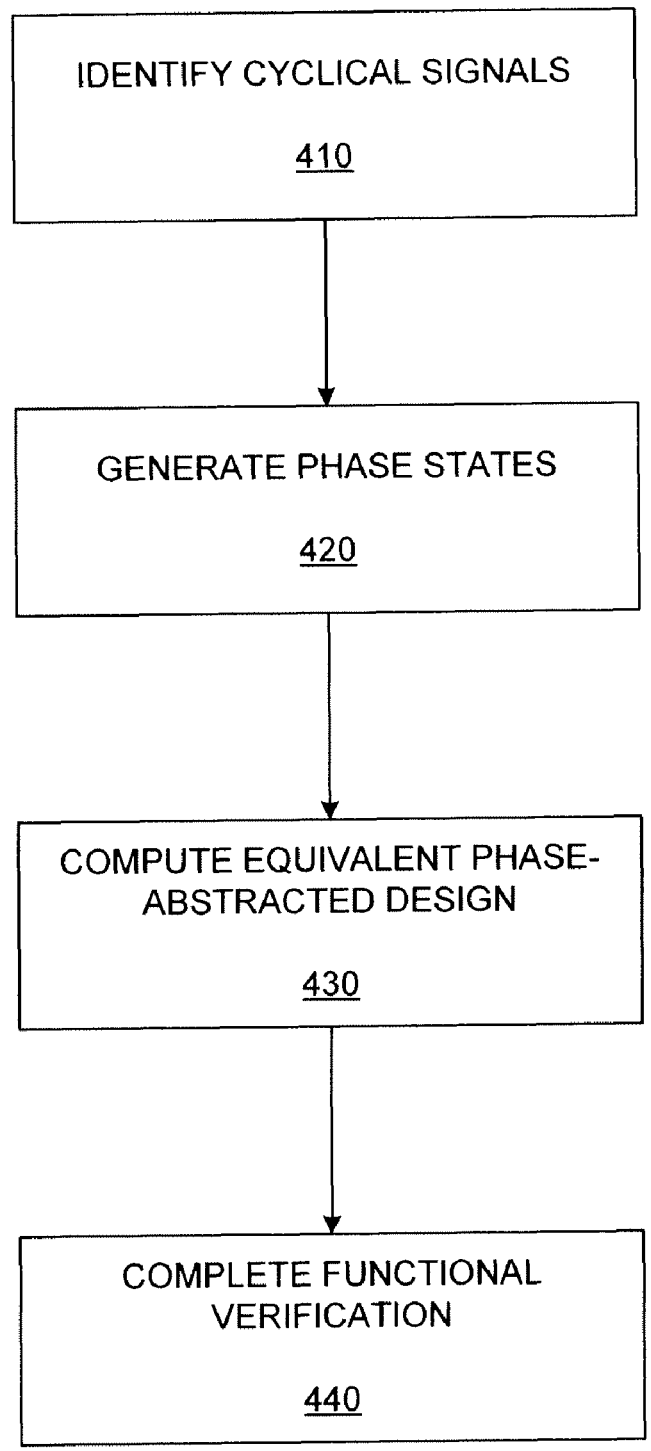
FIGS. 4A and 4B are flow diagrams of phase abstraction processes for design optimization for functional verification.

FIG. 4A shows a flow diagram of a process for performing the transformation described with respect to FIG. 3. First, in an "IDENTIFY CYCLICAL SIGNALS" step 410, register state patterns that exhibit repetitive characteristics (i.e., bit patterns that repeat over and over) are identified within the original design. Then, in a "GENERATE PHASE STATES" step 420, those cyclical (clock-like) signals are used to derive register state vectors for each of a desired number of phases (to be used in subsequent design simplification). Using this phase and register state information, the original design is transformed into a phase-abstracted design (e.g., phase abstracted design 300' in FIG. 3) in a "COMPUTE EQUIVALENT PHASE-ABSTRACTED DESIGN" step 430. The transformation involves creating duplicate sets of the original design logic for each of the phase states defined in step 420, and then reducing the complexity of that "unwound design" using the register state vectors defined in step 420. Subsequent functional verification processing can then be performed on the phase-abstracted design in a "COMPLETE FUNCTIONAL VERIFICATION" step 440.

Figure 4B:
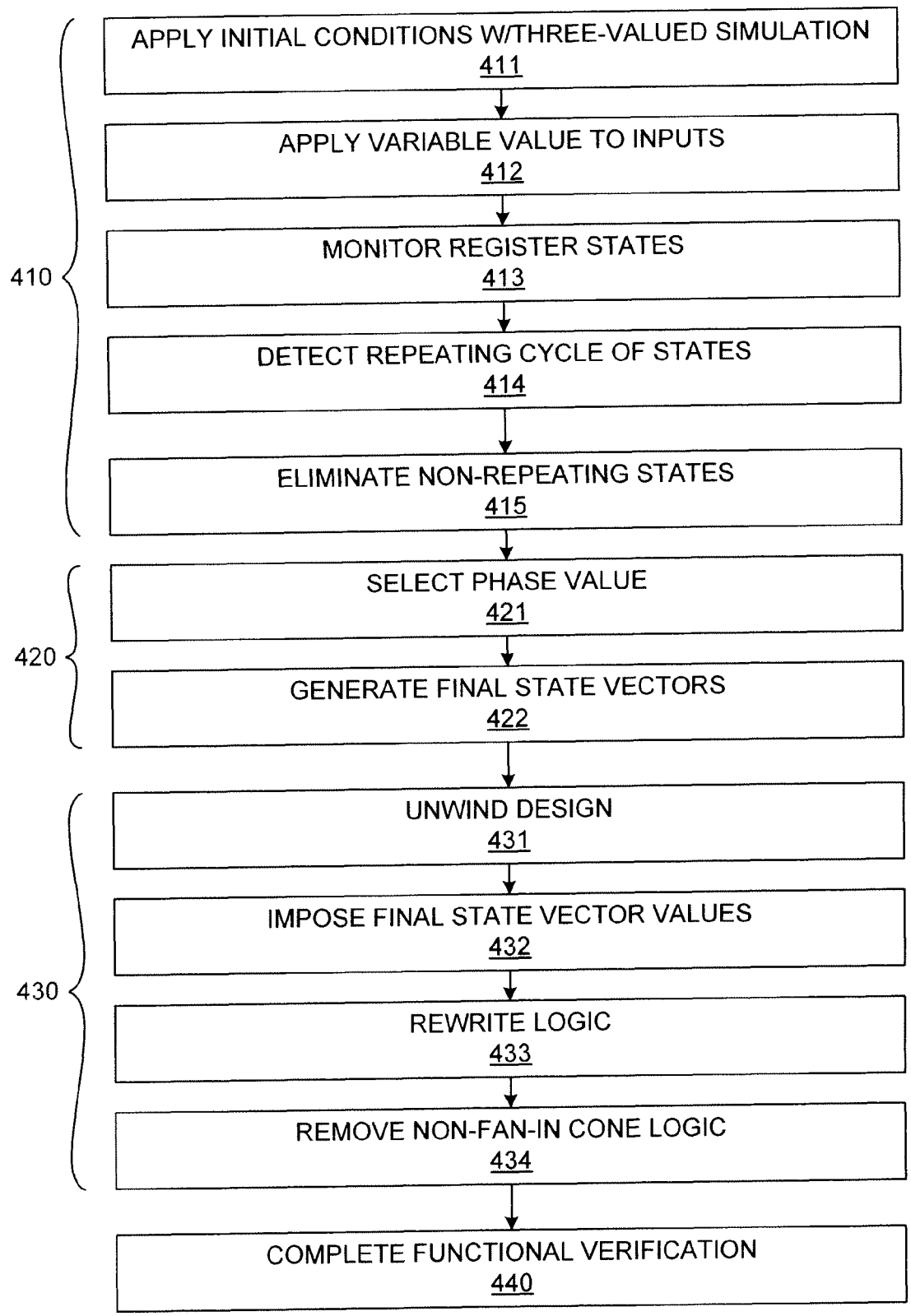

FIG. 4B shows an embodiment of the transformation process shown in FIG. 4A that includes details for steps 410, 420, and 430. In FIG. 4B, step 410 begins with an "APPLY INITIAL CONDITIONS WITH THREE-VALUED SIMULATION" step 411. In three-valued simulation, a two-state system (i.e., standard values of logic HIGH and logic LOW) is evaluated using three different signal values: 0 (logic LOW), 1 (logic HIGH), and X (logic unknown). Nodes for which signal values can be precisely computed are assigned the appropriate values of 0 or 1 (i.e., constant values), and any remaining nodes are assigned the value X (i.e., a variable value).

For example, the output of an AND gate that receives inputs of 1 and X cannot be determined since the output value depends on the (unknown) value of X. Therefore, the output of such an AND gate is assigned the value X. However, if one of the known inputs to an AND gate is 0, the output of that AND gate will always be 0, regardless of the value of the other input. Therefore, an AND gate that receives inputs of 0 and X can be assigned an output value of 0. In this manner, the state of the circuit can be specified at any given time using the three values 0, 1, and X. Note that the initial conditions for the design are typically provided by the user, but can be defined in any manner that specifies some or all of the register values.

Next, in an "APPLY VARIABLE VALUE TO INPUTS" step 412, the value X is applied to all the inputs of the circuit. Then, as the circuit is clock cycled, the changing register values are compiled in a "MONITOR REGISTER STATES" step 413. For example, in an original circuit containing four registers R1, R2, R3, and R4, a state vector V is defined as <RV1,RV2,RV3,RV4>, where values RV1, RV2, RV3, and RV4 represent the state bits stored in registers R1, R2, R3, and R4, respectively. At each clock cycle, a new state vector V is generated, as values of state bits RV1-RV4 in registers R1-R4, respectively, are modified by the circuit logic. Therefore, the three-valued simulation generates a series of simulation register state vectors that capture the changing values of the state bits RV1-RV4.

Because three-valued simulation mandates a finite number of different register state vectors, the series of simulation register state vectors must eventually generate a repeated register state vector (i.e., a register state vector that is identical to a previously generated register state vector). When the repeated register state vector is detected in a "DETECT REPEATING CYCLE OF STATES" step 414, it can be determined that the register state vectors between a cycle-starting state vector (the state vector that is identical to the repeated register state vector) and a cycle-ending state vector (the state vector immediately preceding the repeated register state vector) will be repeated continuously from that point onward.

For example, the simulation will eventually generate a state vector V(k) (i.e., the kth state vector in the sequence of state vectors) that is the same as a previously generated state vector V(j) (i.e., the jth state vector in the sequence of state vectors). Any subsequent state vector generation will simply produce a repeating cycle of state vectors V(j) through V(k−1) (i.e., the state vector immediately preceding state vector V(k)). Therefore, state vectors V(j) (i.e., the cycle-starting state vector) through V(k−1) (i.e., the cycle-ending state vector) can be considered a "cycle series". A "stem series" of state vectors can then be defined that are generated prior to cycle-starting state vector V(j). The stem series therefore runs from state vector V(0) (i.e., the initial state vector in the simulation series) to state vector V(j−1) (i.e., the stem-ending state vector). Note that the infinitely repeating characteristic of the cycle series state vectors only applies if the original design is a closed system (i.e., no inputs are provided to the system during operation except for the original set of inputs). Most circuit designs are designed as (and most functional verification tools are designed to process) closed system designs.

Note further that in one embodiment, if an excessively long series of non-repeating state vectors is being generated by the simulation, or if the detected cycle series of state vectors is impractically long, a shorter cycle can be induced by "downgrading" one or more value state bits to the variable value (X). For example, by setting state bit RV1 for the state vector <RV1,RV2,RV3,RV4> equal to the variable value X, a repeating bit pattern need only be found for state bits RV2-RV4, making a shorter cycle length for the series of state vectors much more likely. Note that any cycle detected in the presence of such a downgrading(s) will still be a valid repeating cycle, since the three-valued simulation logic is such that the use of the variable value X at a particular location mandates that subsequently derived solutions be valid for any instantiation of value X at that location (note further that excessive downgrading will result in the trivial cycle where a state vector with every state bit set to X just cycles back to itself). The downgrading can be particularly effective when applied to state bits for which no repeating patterns are detected (or exhibit repeating patterns having excessively long periods).

Once the cycle series has been defined in step 414, the stem series is eliminated from the simulation in an "ELIMINATE NON-REPEATING STATES" step 415, so that subsequent analysis can be applied to a simple logic loop (i.e., just the consistently repeating behavior of the cycle series). The stem series of state vectors represent register behavior that is not captured within the cycle series of state vectors. Therefore, while a reasonable approximation could be to simply define the initial register conditions as that of state vector V(j), this would cause the loss of any information present within the stem series of state vectors.

Accordingly, in another embodiment of the invention, each of the stem series state vectors, beginning with the last sequence state vector (V(j−1)), is "folded" into its corresponding cycle series state vector (described in greater detail below). For example, the last stem series state vector (V(j−1)) is folded into the last cycle series vector (V(k−1)), the second to last stem series state vector (V(j−2)) is folded into the second to last cycle series vector (V(k−2)), and so on for all the remaining stem series state vectors.

"Folding" involves comparing the corresponding bits of two or more state vectors, and then setting each state bit that does not exhibit the same value across all state vectors equal to the variable value X. For example, consider the following sequence of state vectors:

TABLE 1

| TIME | VECTOR | RV1 | RV2 | RV3 | RV4 |
|---|---|---|---|---|---|
| 0 (initial) | V0 | 1 | 0 | X | 0 |
| 1 | V1 | 0 | 1 | X | 0 |
| 2 | V2 | 1 | 0 | X | 1 |
| 3 | V3 | 0 | 1 | X | 1 |
| 4 | V4 | 1 | 0 | X | 1 |

Since state vector V4 is the same as state vector V2, state vectors V2 and V3 can be defined as the cycle series state vectors (note that the cycle series does not include state vector V4, since it is a duplicate of state vector V2). The state vectors (V0 and V1) preceding the first cycle series state vector (V2) can then be defined as the stem series state vectors.

The folding operation can then begin with the folding of the last stem series state vector (V1=<0,1,X,0>) into the last cycle series state vector (V3=<0,1,X,1>). Since the last bit is different in the two state vectors, state vector V3 is transformed into the state vector <0,1,X,X>. The next stem series state vector (V0=<1,0,X,0>) is folded into the next cycle series state vector (V2=<1,0,X,1>) to transform state vector V2 into the state vector <1,0,X,X>. In this manner, a final cycle series of state vectors <1,0,X,X>, <0,1,X,X> is generated.

Note that if a stem series state vector is folded into the first cycle series state vector before the first stem series state vector is reached, the next stem series state vector is folded into the last cycle series state vector. Therefore, each of the stem series of state vectors is folded in reverse sequence into a corresponding one of the cycle series of state vectors taken in reverse sequence, with the reverse sequence of the cycle series looping back to the cycle-ending state vector if the cycle-starting state vector is reached (i.e., if the number of stem series state vectors is larger than the number of cycle series state vectors).

For example, a stem series might include state vectors V10 through V15, while the subsequent cycle series might include state vectors V16, V17, and V18. To perform a folding operation, state vector V15 would be folded into state vector V18, state vector V14 would be folded into state vector V17, and state vector V13 would be folded into state vector V16. Since state vector V16 is the first cycle state vector, the process loops back to the last cycle state vector, and state vector V12 is folded into state vector V18 (and state vectors V11 and V10 are subsequently folded into state vectors V17 and V16, respectively).

Once the final cycle series of state vectors has been generated in step 415, step 420 begins with a "SELECT PHASE VALUE" step 421. In step 421, the number of phases to be abstracted in subsequent steps is selected from one of the divisors of the original cycle length (i.e., the number of state vectors in the original cycle series). For example, if the cycle series includes 36 state vectors, the phase value selected in step 421 can be any of 2, 3, 4, 6, 9, 12, 18, or 36 (i.e., any of the divisors of the original cycle length and the original cycle length itself).

In picking the phase value in step 421, various considerations can be of significance. First, since subsequent circuit simplification (i.e., step 430) involves unrolling the circuit (basically copying the circuit) by a number of times equal to the phase value, a very large phase value can be impractical due to memory limitations. For example, for a cycle series with 36 state vectors, a phase value selection of 4, 6, or 9 might be more appropriate than a phase value selection of 18 or 36. Therefore, in one embodiment, a "threshold period" could be defined that defines a maximum phase value that can be selected.

Secondly, because the simplification process involves applying the constant values (i.e., 0 or 1) from the cycle series of state vectors to the unwound design, it is desirable such constant values be maximized in the final state vectors (described below with respect to step 422) for a particular phase value selection. This constant value maximization can be achieved, for example, by selecting the phase value such that many of the constants that appear in the original cycle series of state vectors repeat with a period equal to the phase value or some factor of the phase value. For example, if many of the constant values in an original cycle sequence having length 36 (i.e., 36 state vectors) repeat with periods of 3 and 6, a phase value selection of 6 might be more appropriate than a phase value selection of 4. In one embodiment, the phase value can be selected to be equal to a mode period (i.e., period occurring with greatest frequency) for state bits in the final cycle series of state vectors.

In response to the phase value selection in step 421, the register values for each phase are finalized in a "GENERATE FINAL STATE VECTORS" step 422. If the phase value selected in step 421 is the same as the original cycle length, no state vector modifications are required. However, if the phase value is a divisor of the original cycle length, the original cycle series of state vectors must be scaled down to a new cycle series having a cycle length equal to the smaller phase value. This scaling can be performed by dividing the original cycle series of state vectors into consecutive sequences of state vectors having lengths equal to the phase value, and then folding the sequences into one another to generate a single sequence of state vectors having a cycle length equal to the phase value.

For example, Table 2 shows an exemplary set of cycle series state vectors V21-V24:

TABLE 2

| VECTOR | RV1 | RV2 | RV3 | RV4 |
|---|---|---|---|---|
| V21 | 1 | 0 | X | X |
| V22 | 0 | 0 | X | X |
| V23 | 1 | 0 | X | 1 |
| V24 | 0 | 1 | 1 | 1 |

The cycle series listed in Table 2 includes four state vectors (V21-V24) and therefore has a cycle length of four. To scale the cycle series down to a phase value of two, the series of state vectors can be broken into two sequences of two state vectors V21-V22 and V23-V24. Then, the corresponding state vectors in each sequence can be folded together to generate a phase-adjusted set of state vectors. The folding is performed in substantially the same manner as described with respect to the state vectors in Table 1 (above) by comparing the corresponding bits of corresponding state vectors and replacing those bits that differ between state vectors with the value X.

For example, state vector V21 (<1,0,X,X>) can be folded into state vector V23 (<1,0,X,1>) to generate a phase-adjusted state vector <1,0,X,X>. Similarly, state vector V22 (<0,0,X,X>) can be folded into state vector V24 (<0,1,1,1>)

to generate a phase-adjusted state vector <0,X,X,X>. Therefore, the phase-adjusted series of state vectors would be <1,0, X,X>, <0,X,X,X>. This sequence of state vectors indicates that for the two repeating phases of operation for the circuit, the first state bit will always be in a logic HIGH value in the reset state (and all subsequent first phase states), and will always be in a logic LOW value during second phase states. Therefore, the first state bit will cycle forever between logic HIGH and logic LOW values. Similarly, the second state bit will cycle forever between logic LOW and the variable value (X).

Once the final cycle series of state vectors is determined in step 422, the phase abstraction of the original design can begin with an "UNWIND DESIGN" step 431. To "unwind" a design means to duplicate the logic a certain number of times and to connect those duplicate logic sets in series by removing registers from all but one of the duplicate logic sets and connecting the (now unattached) register input/output nodes between duplicate logic sets. In particular, the original design is unwound a quantity "P" times, where P is the cycle length determined in step 422. In one embodiment, forming the "unwound design" can include the steps of:

(1) arranging the duplicate logic sets in series from a first duplicate logic set to a last duplicate logic set,
(2) breaking the connection between the registers and input register nodes (i.e., the logic nodes intended to be directly connected to register inputs) in the first duplicate logic set,
(3) removing the registers in the remaining duplicate logic sets, and
(4) connecting the register output nodes (i.e., the logic nodes intended to be directly connected to register outputs) in each of the duplicate logic sets (except for the first duplicate logic set) to the corresponding register input nodes of duplicate logic set immediately ahead of the current duplicate logic set in the series.

In this manner, an unwound design is created that is made up of duplicates of the logic in the original design fed by a single set of registers. The unwound design includes a quantity P of the duplicate logic sets (i.e., P sets of logic, P sets of inputs, and P sets of outputs), and is therefore roughly P times larger than the original design. Since each of the duplicate logic sets in the unwound design represent a unique phase of the original design, each of the duplicate logic sets is associated with a unique set of inputs, outputs, and register values.

After the unwinding of step 431, the clock-like signals detected in step 414 can be imposed on the appropriate registers or register output nodes within the unwound design in a "IMPOSE FINAL STATE VECTOR VALUES" step 432. Note that imposing a value at a particular register means replacing that register with the value, while imposing a value at a particular register output node means breaking the connection between that register output node and its associated register input node and providing the value at the register output node. For example, a series of phase-adjusted state vectors <1,0,X,X> (associated with a first phase) and <0,X, X,X> (associated with a second phase) could be generated in step 422. Therefore, the state bit values 1 and 0 could be imposed in place of the first register and the second register that feed the first duplicate logic set (associated with the first phase). Likewise, the state bit value 0 could be imposed at the register output node in the second duplicate logic set (associated with the second phase) corresponding to the first register (and simultaneously breaking the connection between that register output node of the second duplicate logic set and the corresponding input register node of the first duplicate logic set). Note that this imposition of clock-like signal values will generally reduce the number of registers in the unwound layout.

Next, using the imposed values from step 432, the logic in the unwound design can be further reduced in a "REWRITE LOGIC" step 433. In logic rewriting, the values imposed in step 432 are propagated through the unwound design and any unnecessary or unused logic (i.e., logic that is not used in the generation of any outputs) is reduced or removed. For example, if a 0 value imposed during step 432 is fed to one input of an AND gate, that AND gate can be replaced with an imposed 0 value (i.e., regardless of the value of the other input to the AND gate, its output will always be 0 and therefore can be imposed). Also, while each of the duplicated logic sets generated in step 431 will initially include all the inputs to the logic that are present in the original design, during any given phase, many of those inputs will not be used, and so can also be removed by logic rewriting.

Finally, in an optional "REMOVE NON-FAN-IN CONE LOGIC" step 434, all logic that is not in the recursive fan-in cones of the outputs of the unwound design is removed. As is known in the art, the fan-in cone of an output is all the logic that feeds into that output from either a register or an external input. Note that each register that feeds a fan-in cone will itself be fed by another fan-in cone. Therefore, recursive fan-in cone of an output can be defined as the entire set of fan-in cones (and registers) that feed external inputs of the circuit to that output. Accordingly, any logic and/or registers not in the recursive fan-in cones of the outputs of the unwound design have no effect on those outputs, and hence can be removed from the unwound design.

In one embodiment, determining the non-fan-in cone logic can be performed by first marking all the logic in the fan-in cones for the outputs, marking all the registers feeding that marked logic, marking all the logic in the fan-in cones for the marked registers, and continuing in this manner until no new registers are marked. Any logic or registers not marked at this point are not in the recursive fan-in cones of the output and can therefore be removed from the unwound design to complete step 434. While not required, step 434 can further reduce the complexity of the unwound design to further reduce the computational requirements of subsequent functional verification processing in step 440.

Figure 5A:
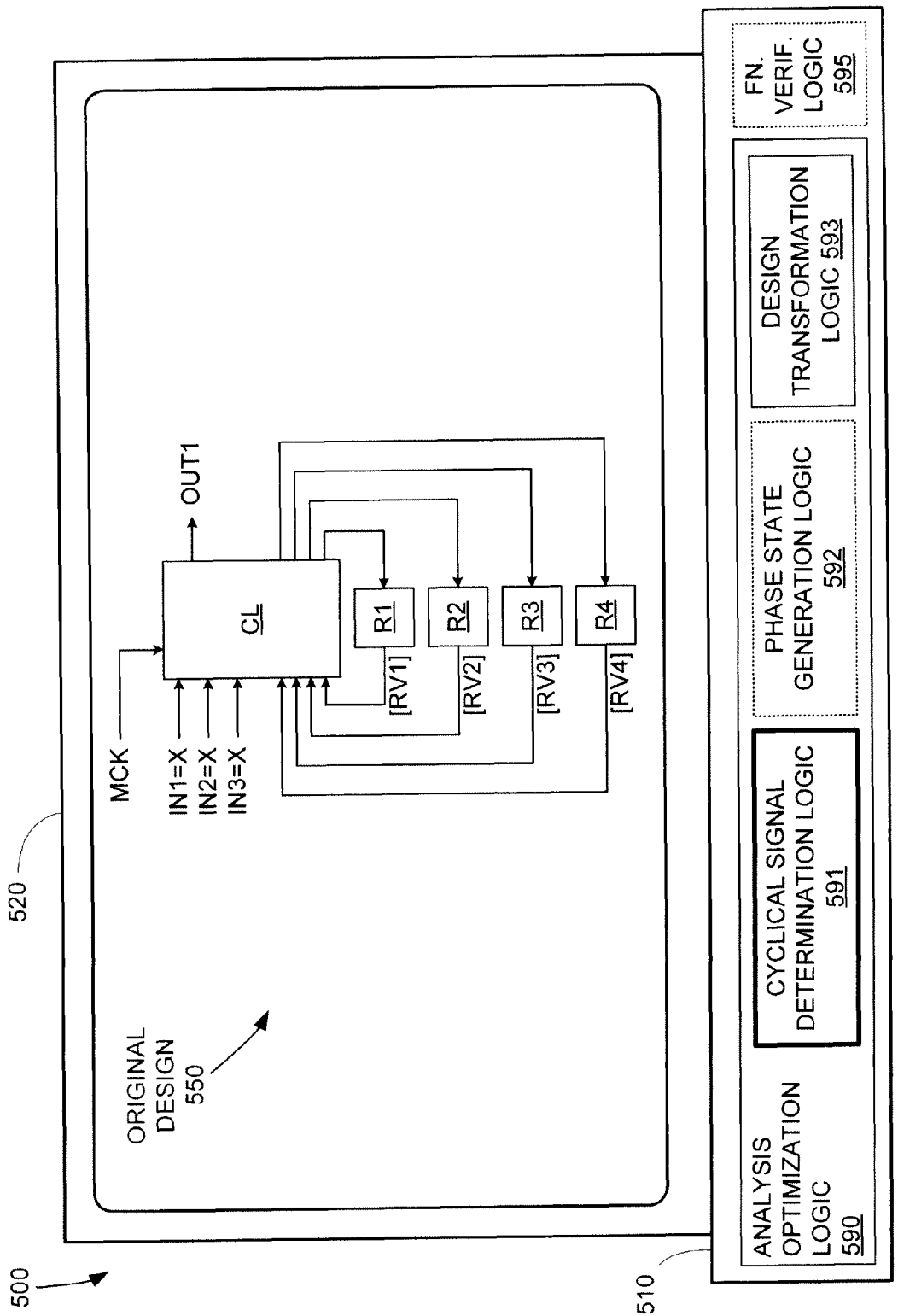

FIG. 5A shows an embodiment of a computer system 500 for performing formal verification as described with respect to the flow diagram in FIG. 4B. Computer system 500 includes a processing system 510 (e.g., a personal computer or client workstation) and a graphical display 520 (e.g., a monitor). Processing system 510 can comprise analysis optimization logic 590 that includes cyclical signal determination logic 591, phase state generation logic 592, and design transformation logic 593. Processing system 510 can also include optional functional verification logic 595. In one embodiment, analysis optimization logic 590 can be integrated within functional verification logic 595 (e.g., in a single software program). Note that analysis optimization logic 590 (and functional verification logic 595) can comprise a software program (computer instructions) encoded on a computer-readable medium (e.g., hard drive, CD-ROM, or DVD-ROM) in processing system 510 or external to processing system 510 (e.g., processing system 510 can be a "thin client" that runs the software from a network-attached server).

Cyclical signal determination logic 591 identifies clock-like register behavior in an original layout using three-valued simulation, as described with respect to step 410 in FIG. 4A and/or steps 411 through 415 in FIG. 4B. Phase state generation logic 592 selects a number of phases and determines register state vectors for each of those states, as described with respect to step 420 in FIG. 4A and/or steps 421-422 in FIG. 4B. Based on the phase number and state vectors, design transformation logic 593 can then transform the original design into a phase-adapted design that is optimized for functional verification, as described with respect to step 430 in FIG. 4A and/or steps 431-434 in FIG. 4B. Functional verification logic 595 can then perform functional verification logic on the phase-adapted design. In one embodiment, functional verification logic 595 can comprise any existing code for performing formal verification.

An example of the optimization performed by analysis optimization logic 690 is depicted on graphical display 682 in FIGS. 5A-5G. In FIG. 5A, an original design 550 includes a set of original (combinational) logic CL coupled to receive inputs IN1, IN2, and IN3, and a master clock MCK, and generate an output OUT1. Original logic CL also includes registers R1, R2, R3, and R4 that store values RV1, RV2, RV3, and RV4, respectively. To begin a functional verification process, clock-like signal identification logic 591 applies an initial set of conditions to original design 550 (step 411 in FIG. 4B) using three-valued simulation parameters (i.e., values 0, 1, and X). The variable value X is then provided as inputs IN1, IN2, and IN3 (step 412), and the changes in register state vector V <RV1,RV2,RV3,RV4> are monitored in response to clock signal MCK (step 413).

Figure 5C:
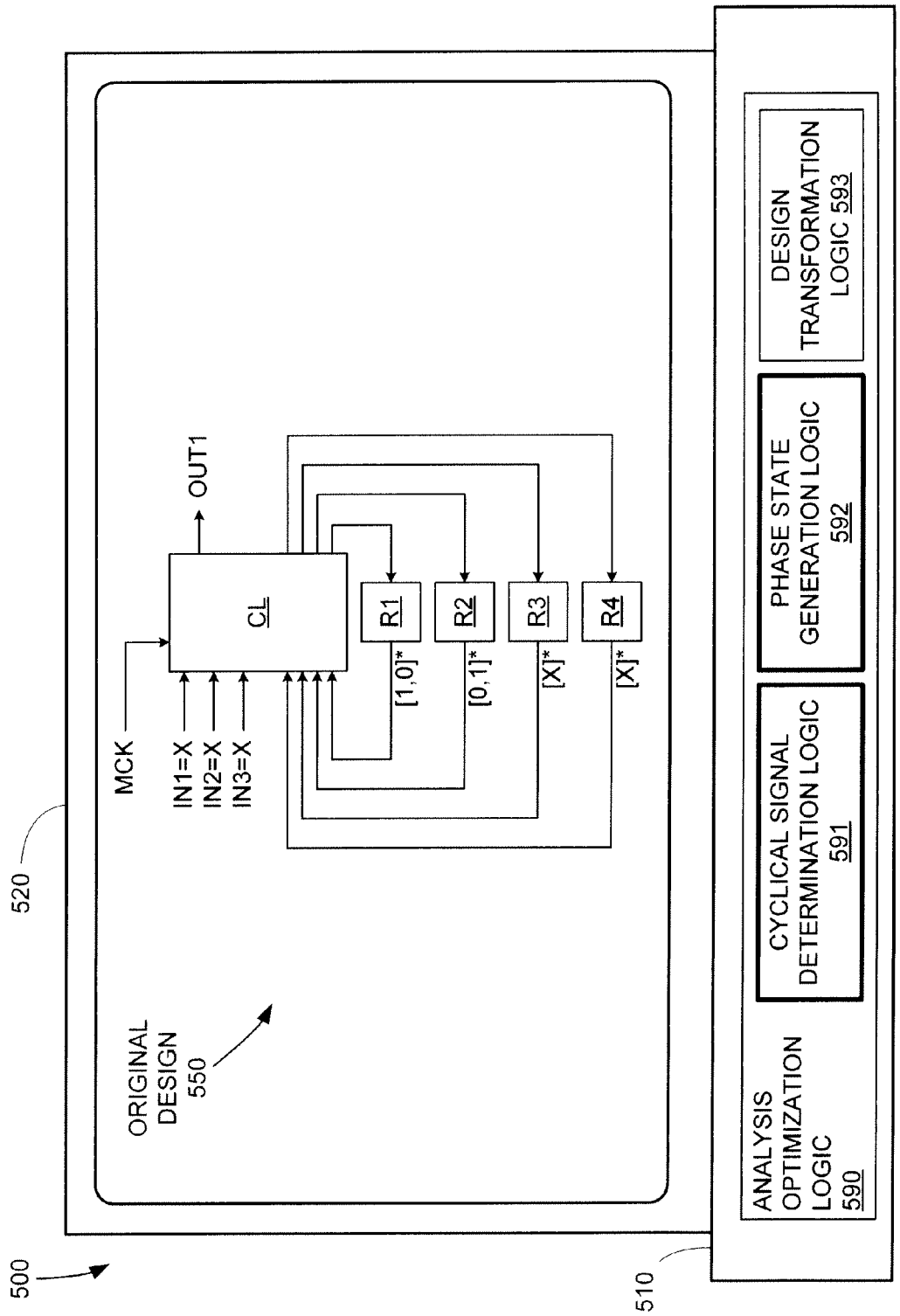

When a repeated set of state bit values is detected in state vector V, an original cycle series of state vectors for design 550 can be defined (step 414). For example, in FIG. 5B, an exemplary sequence of state vectors V0=<1,0,X,0>, V1=<0,1,X,0>, V2=<1,0,X,1>, V3=<0,1,X,1>, and V4=<1,0,X,1> is depicted. Since state vector V4 matches state vector V2, an original cycle series of state vectors can be defined to include state vectors V2 and V3, while a stem series of state vectors can be defined to include state vectors V0 and V1. Stem series state vectors V0 and V1 can then be folded into cycle series state vectors V2 and V3, respectively (step 415), to generate a final cycle series of state vectors <1,0,X,X> and <0,1,X,X>, as shown in FIG. 5C. In FIG. 5C, register R1 stores a repeating cycle of 1 and 0 (repetition indicated by the asterisk), while register R2 stores a repeating cycle of 0 and 1. Meanwhile, registers R3 and R4 simply store variable values X. Phase state generation logic can then scale (as necessary) the final cycle series of state vectors down to a phase-adjusted series of state vectors (as described with respect to steps 421 and 422, above). Note that because the cycle length of the final cycle series of state vectors in this example is already at two (the lowest possible non-trivial number of phases) phase state generation logic would simply provide the final cycle series of state vectors as the phase-adjusted series to design transformation logic 593 in FIG. 5D.

Figure 5D:
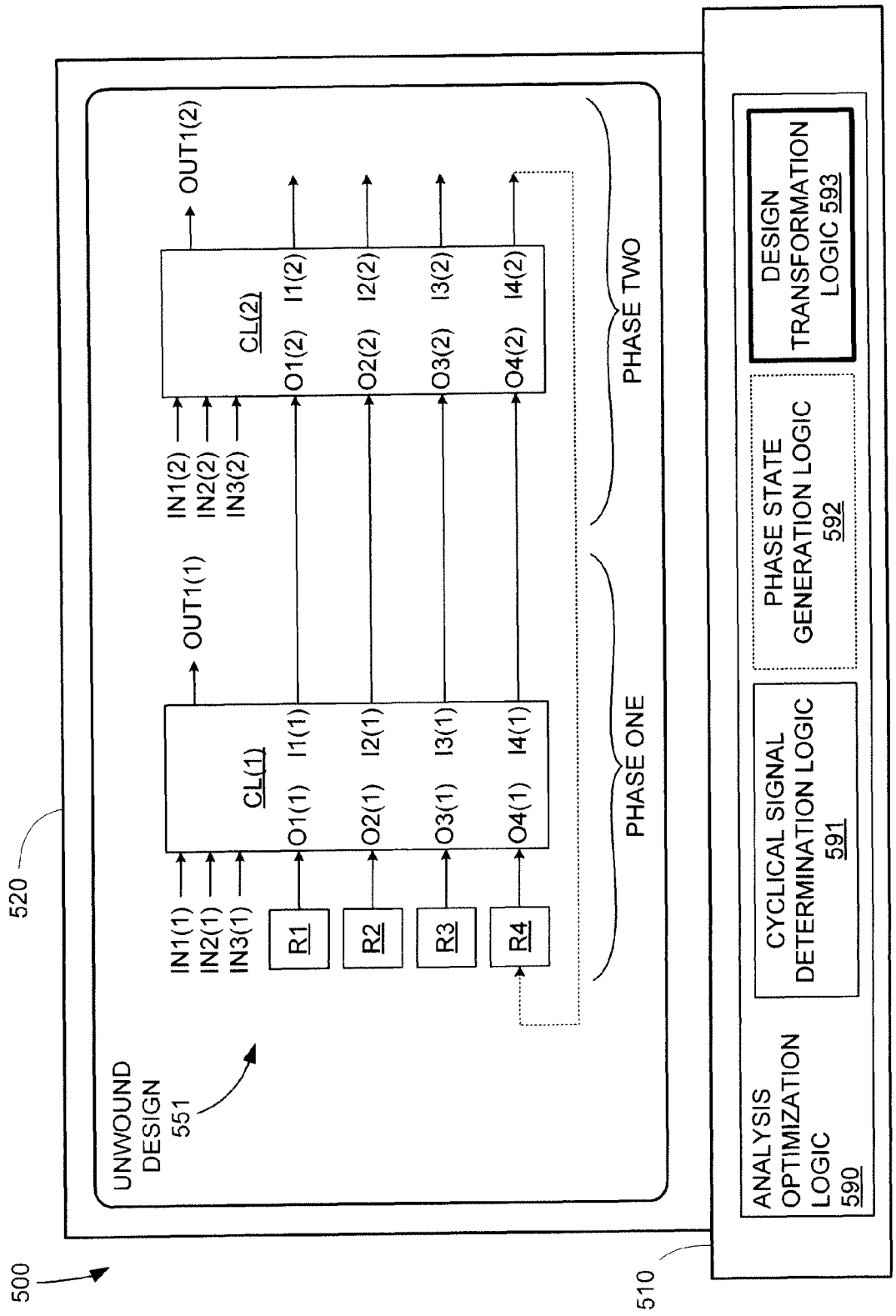

Using the cycle length of the phase-adjusted series of state vectors, design transformation logic 593 can unwind original design 550 (step 431) to create an unwound design 551 as shown in FIG. 5D. Specifically, because the cycle length of the phase-adjusted series of state vectors was determined to be two (in FIG. 5C), two duplicate logic sets CL(1) and CL(2) of original logic CL are created and arranged in series, and the registers are removed from the duplicate logic sets other than the first set (duplicate logic set CL(1)). Meanwhile, the connection between the register input nodes I1(1), I2(1), I3(1), and I4(1) of the first duplicate logic set CL(1) and registers R1, R2, R3, and R4, respectively, of first duplicate logic set CL(1) is broken, and the duplicate logic sets are joined in series by connecting the register output nodes O1(2), O2(2), O3(2), and O4(2) of the second duplicate logic set CL(2) with the corresponding register input nodes I1(1), I2(1), I3(1), and I4(1), respectively, of first duplicate logic set CL(1). Note that the register output nodes of the last duplicate logic set in the series (in this case, register input nodes I1(2), I2(2), I3(2), and I4(2) of second duplicate logic set CL(2)) can be tied to the inputs of the registers of the first duplicate logic set CL(1) (i.e., registers R1, R2, R3, and R4, respectively), as indicated by the dotted line between register output node I4(2) and register R4. However, because some of registers R1-R4 are likely to drop out during subsequent processing, this connection between the last duplicate logic set and the registers of the first duplicate logic set can also be performed later in the process.

Figure 5E:
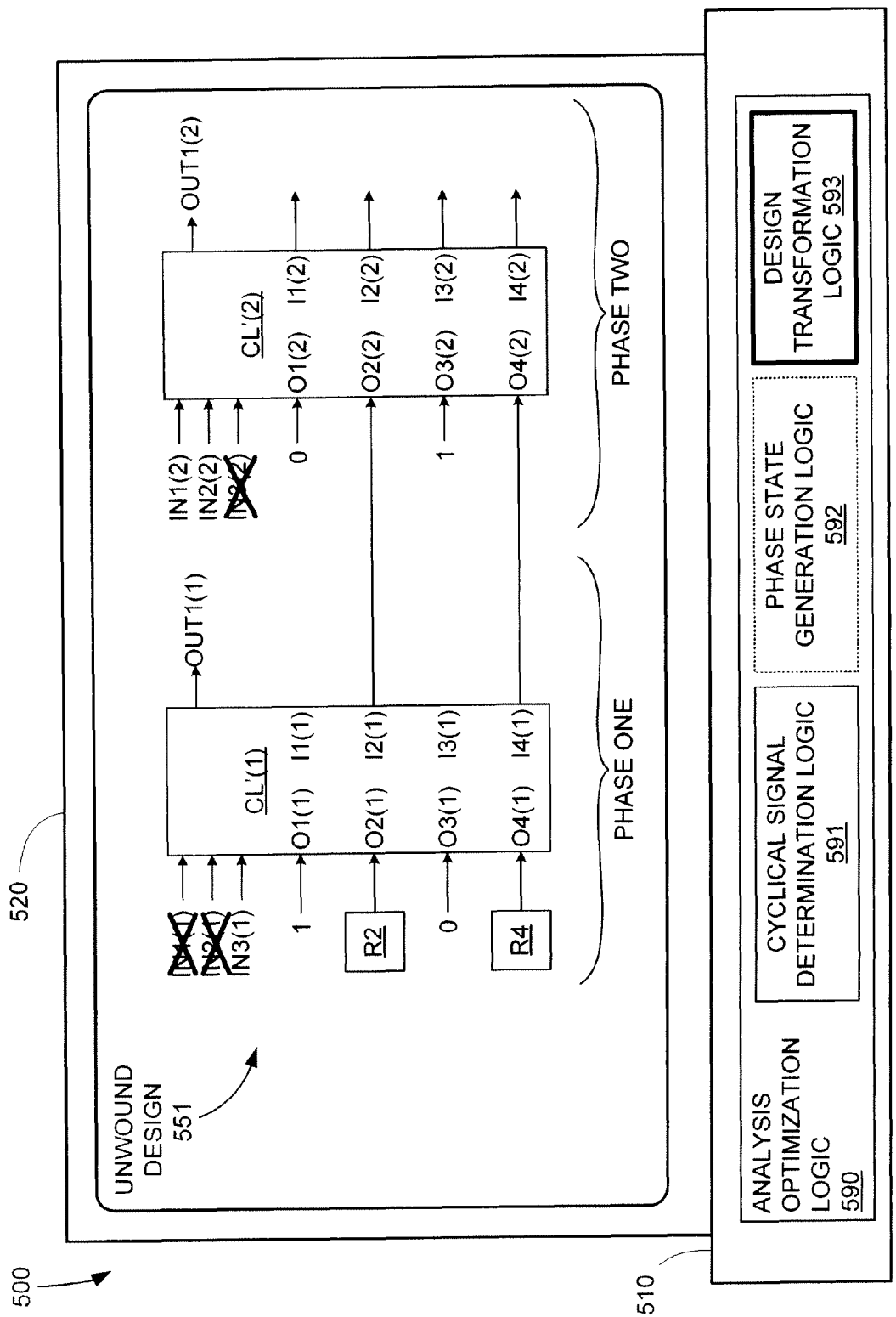

Once unwound design 551 has been generated, design transformation logic 593 can begin optimizing unwound design 551 for subsequent functional verification. For example, as shown in FIG. 5E, the state bit values in the state vectors of the phase-adjusted series can be imposed on unwound design 551 in place of registers or register node connections (step 432). As was described above with respect to FIG. 5C, register R1 in original design 550 exhibited a repeating pattern of [1,0], while register R3 exhibited a repeating pattern of [0,1]. Thus, register R1 in first duplicate logic set CL(1) (associated with phase one) can be replaced with an imposed 1 value, while register R3 can be replaced with an imposed 0 value. Similarly, register output nodes O1(2) and O2(2) in second duplicate logic set CL(2) (associated with phase two) can be replaced with imposed values 0 and 1, respectively. Logic rewriting can be performed on unwound design 551 using these imposed values to generate updated logic sets CL'(1) and CL'(2), in which unnecessary logic is reduced or removed (step 433). Note that for exemplary purposes, inputs IN1(1) and IN2(1) are inactive during phase one, while input IN3(2) is inactive during phase two, so that those inputs are removed during the rewriting process.

Figure 5F:
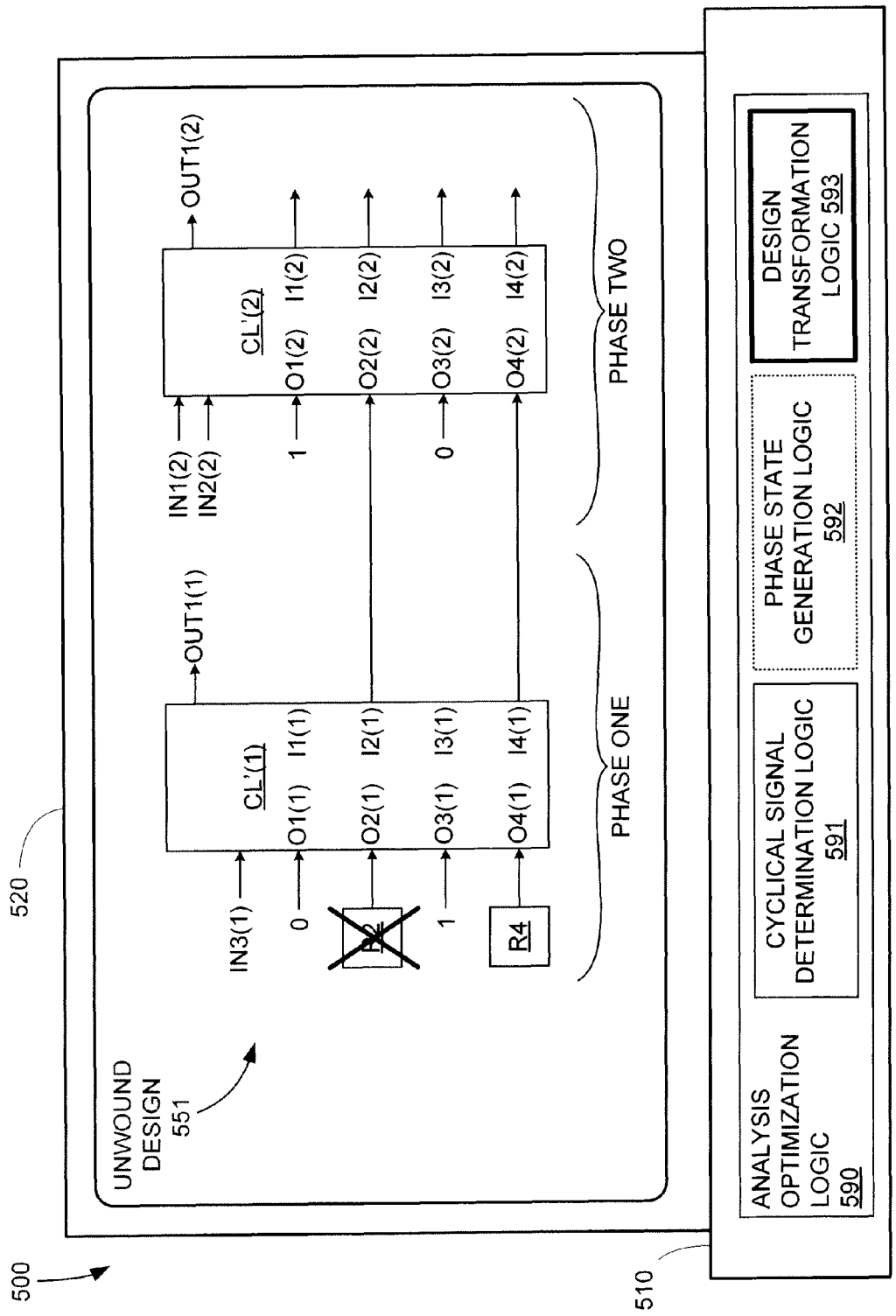

Finally, any remaining registers that are not in the recursive fan-in of the outputs of the duplicate logic sets (i.e., outputs OUT1(1) and OUT1(2)) are removed (step 434), as depicted in FIG. 5F. For example, if register R2 does not ultimately feed into either output OUT1(1) or OUT1(2), then register R2 can be removed from unwound design 551.

Figure 5G:
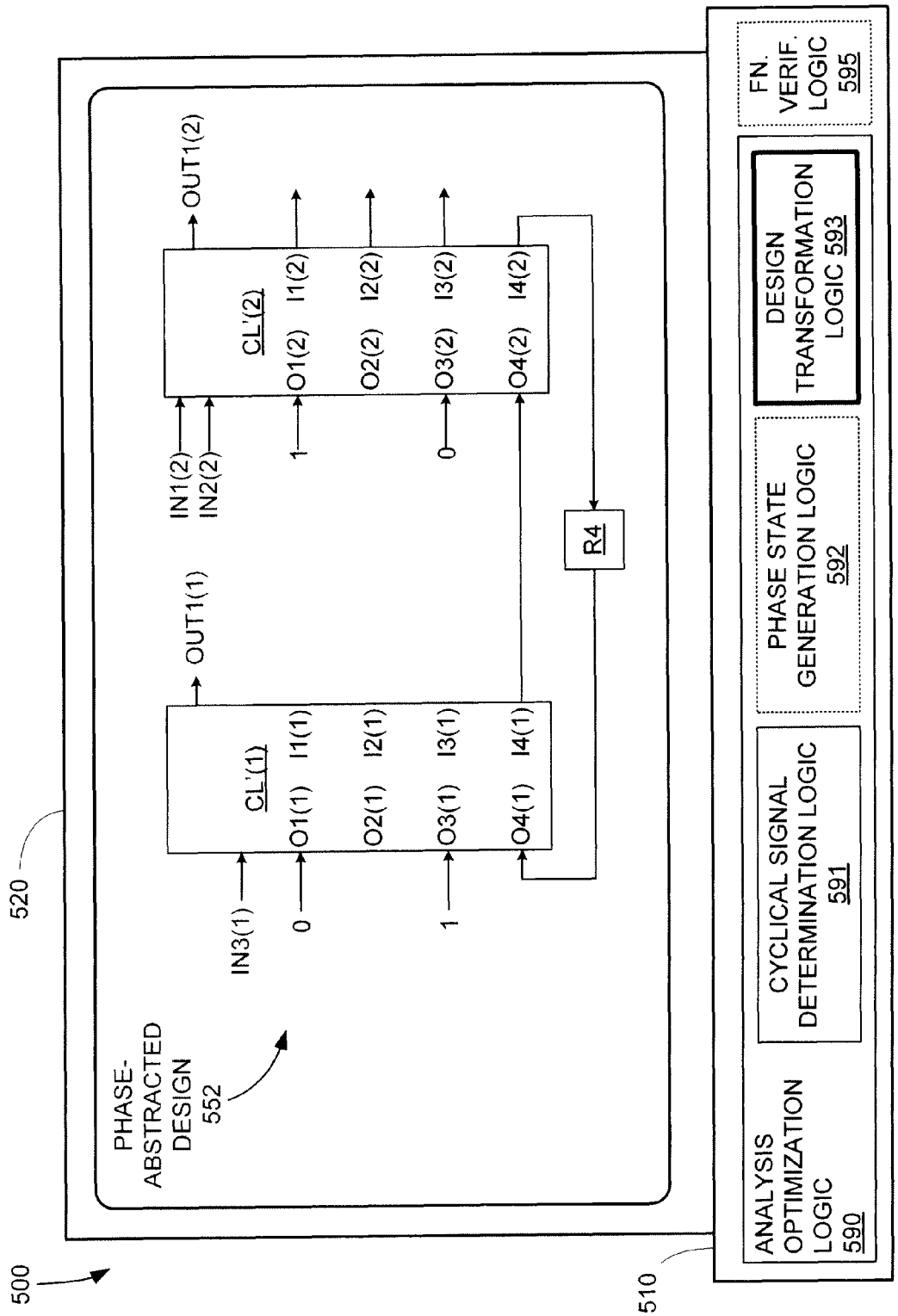

In this manner, the clock-like signal detection, expected maximum period detection, unwinding, and logic reduction depicted in FIGS. 5A-5F enable the generation of a phase-abstracted design 552, as shown in FIG. 5G. Phase-abstracted design 552 includes only one register (R4) and three inputs (IN3(1), IN1(2), and IN2(2)), as compared to the four registers (R1-R4) and three inputs (IN1-IN3) of original design 550 shown in FIG. 5A. Phase-abstracted design 552 can therefore be processed much more efficiently than original design 550 by functional verification logic 595. In general, the larger the number of registers and the more phases in the original design, the greater the benefit provided by generating a phase-abstracted design from that original design. Note that while the transformation of original design 550 into phase-abstracted design 552 is depicted on graphical display 520 for exemplary purposes, in various other embodiments, the transformation can be performed without any visual depiction or with a different visual depiction.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A system for processing a multiphase circuit design, the system including a non-transitory computer-readable medium encoded with logic comprising:
    logic for applying a set of initial conditions to the multiphase circuit design using three-valued simulation, the three-valued simulation using a set of values consisting of 0, 1, and X, wherein the value X represents an unknown state;
    logic for applying a series of clock cycles to the multiphase circuit design while all inputs to the multiphase circuit design are held at the value X;
    logic for monitoring simulation state vectors for a set of registers in the multiphase circuit design to identify an end-cycle state vector that is identical to a start-cycle state vector, the start-cycle state vector being generated prior to the end-cycle state vector; and
    logic for deriving a series of repeating state vectors for the set of registers in the multiphase circuit design based on a series of simulation state vectors between the start-cycle state vector and the end-cycle state vector.

2. The system of claim 1, wherein the logic for monitoring simulation state vectors comprises logic for setting a selected state bit for a selected one of the set of registers equal to the value X.

3. The system of claim 1, further including phase state logic for defining a number of phases for the circuit design.

4. The system of claim 3, further including unwinding logic for generating an unwound design by duplicating the circuit design by the number of phases to generate a plurality of duplicate logic sets, and connecting the plurality of duplicate logic sets by creating direct connections between duplicate logic sets in place of registers.

5. The system of claim 4, further including imposition logic for imposing each of the set of repeating state vectors onto a corresponding one of the plurality of duplicate logic sets.

6. The system of claim 5, further including logic rewriting logic for reducing logic of the unwound design by propagating state bit values from the set of repeating state vectors through the unwound design.

7. A non-transitory computer-readable medium encoded with a program for causing a computer to process a multiphase circuit design, the program comprising:
    instructions for causing the computer to apply a set of initial conditions to the multiphase circuit design using three-valued simulation, the three-valued simulation using a set of values consisting of 0, 1, and X, wherein the value X represents an unknown state;
    instructions for causing the computer to apply a series of clock cycles to the multiphase circuit design while all inputs to the multiphase circuit design are held at the value X;
    instructions for causing the computer to monitor simulation state vectors for a set of registers in the multiphase circuit design to identify an end-cycle state vector that is identical to a start-cycle state vector, the start-cycle state vector being generated prior to the end-cycle state vector; and
    instructions for causing the computer to derive a series of repeating state vectors for the set of registers in the multiphase circuit design based on a series of simulation state vectors between the start-cycle state vector and the end-cycle state vector.

8. The non-transitory computer-readable medium of claim 7, wherein the instructions for causing the computer to monitor simulation state vectors comprises logic for setting a selected state bit for a selected one of the set of registers equal to the value X.

9. The non-transitory computer-readable medium of claim 7, further including instructions for causing the computer to define a number of phases for the circuit design.

10. The non-transitory computer-readable medium of claim 9, further including instructions for causing the computer to generate an unwound design by duplicating the circuit design by the number of phases to generate a plurality of duplicate logic sets, and instructions for causing the computer to connect the plurality of duplicate logic sets by creating direct connections between duplicate logic sets in place of registers.

11. The non-transitory computer-readable medium of claim 10, further including instructions for causing the computer to impose each of the set of repeating state vectors onto a corresponding one of the plurality of duplicate logic sets.

12. The non-transitory computer-readable medium of claim 11, further including instructions for causing the computer to reduce logic of the unwound design by propagating state bit values from the set of repeating state vectors through the unwound design.

* * * * *